United States Patent
Dixon

(10) Patent No.: US 8,963,274 B2
(45) Date of Patent: Feb. 24, 2015

(54) EPITAXIAL STRUCTURE FOR VERTICALLY INTEGRATED CHARGE TRANSFER GATE TECHNOLOGY IN OPTOELECTRONIC MATERIALS

(71) Applicant: Sensors Unlimited, Inc., Princeton, NJ (US)

(72) Inventor: Peter Dixon, Lawrenceville, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 0 days.

(21) Appl. No.: 13/832,450

(22) Filed: Mar. 15, 2013

(65) Prior Publication Data
US 2014/0264437 A1    Sep. 18, 2014

(51) Int. Cl.
| | |
|---|---|
| H01L 31/06 | (2012.01) |
| H01L 31/0328 | (2006.01) |
| H01L 31/0336 | (2006.01) |
| H01L 31/072 | (2012.01) |
| H01L 31/109 | (2006.01) |
| H01L 29/06 | (2006.01) |
| H01L 31/112 | (2006.01) |

(52) U.S. Cl.
CPC .................................. H01L 31/1127 (2013.01)
USPC ...... 257/462; 257/21; 257/189; 257/E31.053; 257/E31.067; 257/E31.073; 257/E31.076; 257/E31.079; 257/E31.082; 257/E33.076; 257/E33.077

(58) Field of Classification Search
CPC .................. H01L 27/14638; H01L 27/14643; H01L 27/14665; H01L 27/14678; H01L 27/14679
USPC ........... 257/21, 189, 462, E31.053, E31.067, 257/E31.073, E31.076, E31.079, E31.082, 257/E33.076, E33.077
See application file for complete search history.

(56) References Cited

U.S. PATENT DOCUMENTS

| | | | | |
|---|---|---|---|---|
| 4,876,209 A | * | 10/1989 | Forrest | 438/91 |
| 4,949,144 A | * | 8/1990 | Kuroda et al. | 257/185 |
| 4,950,044 A | * | 8/1990 | Makita | 385/24 |
| 5,506,418 A | * | 4/1996 | Bois et al. | 257/15 |
| 5,534,714 A | * | 7/1996 | Beam et al. | 257/25 |
| 5,799,030 A | * | 8/1998 | Brenner | 372/50.21 |
| 6,005,266 A | | 12/1999 | Forrest et al. | |
| 6,043,549 A | * | 3/2000 | Gutierrez-Aitken | 257/458 |
| 6,555,890 B2 | | 4/2003 | Dries et al. | |
| 6,573,581 B1 | | 6/2003 | Sugg et al. | |
| 7,629,663 B2 | * | 12/2009 | Pardo et al. | 257/448 |
| 7,759,698 B2 | | 7/2010 | Ogura | |
| 7,873,092 B2 | * | 1/2011 | Masui et al. | 372/50.21 |
| 7,875,946 B2 | * | 1/2011 | Yasuoka et al. | 257/438 |
| 8,022,390 B1 | * | 9/2011 | Kim et al. | 257/21 |

(Continued)

OTHER PUBLICATIONS

Sarathy, Jitel et al. "Monolithic active pixel InGaAs focal plane arrays for near infra-red imaging." SPIE vol. 2999. (1997) pp. 225-234.

(Continued)

*Primary Examiner* — Ida M Soward
(74) *Attorney, Agent, or Firm* — Cantor Colburn LLP

(57) ABSTRACT

A low noise infrared photo detector with a vertically integrated field effect transistor (FET) structure is formed without thermal diffusion. The FET structure includes a high sensitivity photo detector layer, a charge well layer, a transfer well layer, a charge transfer gate, and a drain electrode. In an embodiment, the photo detector layer and charge well are InGaAs and the other layers are InP layers.

20 Claims, 2 Drawing Sheets

(56) References Cited

U.S. PATENT DOCUMENTS

| | | |
|---|---|---|
| 8,274,096 B2 | 9/2012 | Wicks |
| 8,324,659 B2 * | 12/2012 | MacDougal et al. ......... 257/184 |
| 8,450,752 B2 * | 5/2013 | Koda et al. ...................... 257/84 |
| 8,450,773 B1 * | 5/2013 | Kim et al. ...................... 257/184 |
| 2004/0135224 A1 * | 7/2004 | Bui et al. ....................... 257/461 |
| 2006/0001118 A1 * | 1/2006 | Boisvert et al. ............... 257/438 |
| 2012/0168720 A1 * | 7/2012 | Akita et al. ..................... 257/21 |

OTHER PUBLICATIONS

Kim, Quiesup et al. "Two-dimensional Active Pixel InGaAs Focal Plane Arrays." SPIE vol. 4277. (2001). pp. 223-229.

Kim, Q. et al. "Characteristics of Monolithically Integrated InGaAs Active Pixel Imager Array." SPIE. (1999) 9 pgs.

* cited by examiner

EPITAXIAL STRUCTURE FOR VERTICALLY INTEGRATED CHARGE TRANSFER GATE TECHNOLOGY IN OPTOELECTRONIC MATERIALS

BACKGROUND

This invention generally relates to a device for detecting radiation in the near infrared spectrum. In particular, the invention relates to a low noise IR detector formed without thermal diffusion.

Modern infrared (IR) imaging systems can be focal plane arrays of detectors and associated integrated circuitry in each pixel that transforms the collected signals into visual or other analyzable means. Near IR detector systems that operate in the 1 to 1.7 µm wavelength region are sometimes combined with visible detection systems that operate in the 400 to 700 nm wavelength range to enhance detection and visualization in low light and early night scenarios. Combined visible and near IR imaging capability is increasingly becoming a strategic requirement for both commercial and military applications. Of the many materials used for imaging systems that operate in the near infrared (e.g. HgCdTe, Ge, InSb, PtSi, etc.), InGaAs p-i-n photo diodes have been chosen due to their high performance and reliability (G. Olsen, et al., "A 128×128 InGaAs detector array for 1.0-1.7 microns," in Proceedings SPIE, Vol. 1341, 1990, pp. 432-437).

Near IR imaging arrays are normally hybrid devices where the photodiodes are connected to silicon transistor read out integrated circuitry (ROIC). In one effort to decrease cost and simplify complex manufacturing, an InGaAs/InP photo diode has been integrated with an InP junction field effect transistor (JFET) as a switching element for each pixel as described by U.S. Pat. No. 6,005,266, Forrest et al. and incorporated herein by reference in its entirety. The combination of photodiode and FET on a single substrate enabled the formation of fully monolithic near IR focal plane arrays with reduced production cost and increased performance. The InP junction field effect transistors exhibited leakage currents as low as 2 pA. In related work, intentional doping of the absorption layer of a GaAs p-i-n photodiode was found to reduce the dark current as described by U.S. Pat. No. 6,573,581, Sugg. et al. and incorporated herein by reference in its entirety.

Continued improvement of compound semiconductor near IR integrated detection systems is needed.

SUMMARY

A low noise infrared photo detector may be formed without thermal diffusion processing. The photodetector may contain a field effect transistor structure that includes a vertically integrated stack of photo sensitive layers as well as pn junctions separated by a layer of sufficient doping and band gap as to form a barrier for carrier migration. The layers include a high sensitivity photodetector layer, a charge well layer, a transfer well layer, a charge transfer gate, and a drain electrode. In an embodiment, the photo detector layer and charge well are InGaAs and the other layers are InP layers.

DETAILED DESCRIPTION

The present invention relates to a near IR photo conductor device that may be described as a field effect transistor (FET) with a buried source and external gate and drain electrodes. By addressing the gate from an external source (such as from a ROIC pixel) the collection of photo current can be matched to specifically triggered events. Although the photodetector device of the present invention is based on InGaAs/InP material and device technology, the methods and other features discussed herein are not intended to be limited to that material system alone and other III-V and II-VI compound semiconductor materials are included in the scope of the invention.

Figure 1:
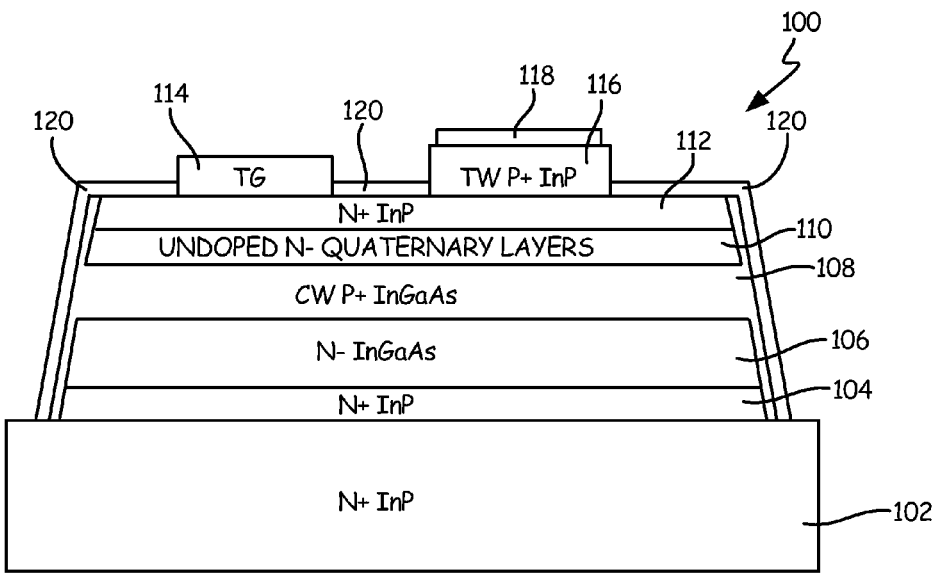
FIG. 1 is a schematic cross section of the IR detector of the invention.

A schematic cross section of an embodiment of the invention is shown in FIG. 1. Photoconducting field effect transistor (FET) 100 is a multilayer structure formed on substrate 102. In this embodiment, substrate 102 comprises conductive InP which is typically Sulfur doped N+ material. The doping level is sufficient for N-type ohmic contacts, and as such, typically >1E+18. N+InP buffer or carrier migration barrier layer 104 is on N+InP substrate 102. N+InP buffer or carrier migration barrier layer 104 is nominally defined as of sufficient thickness so as to provide an epitaxial base for a high quality heterostructure. For the purposes of this invention, buffer or carrier migration barrier layer 104 is also conductive, typically doped N-type using Si in organometallic vapor phase epitaxy/metal-organic chemical vapor deposition (OMVPE/MOCVD) epitaxial growth. In an embodiment, carrier migration barrier layer 104 may be InAlAs or InAlGaAsP. Active collection layer 106 comprises undoped N−InGaAs of sufficient thickness so as to provide full absorption of photon radiation in the wavelength band of interest. In an embodiment, active collection layer 106 may be InAlGaAsP. P+InGaAs charge well layer 108 is deposited on InGaAs collection layer 106 and acts as part of a collection well for photo generated carriers formed in active collection layer 106. P+InGaAs layer 108 forms the charge well. In an embodiment, charge well layer 108 may be InGaAsP. Layer 110 is a carrier migration barrier layer formed by undoped N-quaternary layers comprising an InAlAsP material system with a stepped composition gradient as to maintain lattice constant continuity and to provide steps in energy to accommodate the valence band offset across the heterojunction from layers 106 to 110. It is also proposed that layer 110 may be comprised of a continuously graded composition, such that the energy band edge is graded, rather than stepped. Note also in at least one construction of the invention, layer 110 is comprised of a ternary compound, InAlAs with capability of forming a higher bandgap insulator and processing to form an electrical barrier. In such a construction, the thickness is designed so as to control the threshold potential across such a barrier. Layer 112 is an N+InP blocking (or cap) layer comprising sufficient thickness so as to effectively passivate lower bandgap layers and all quaternary layers 110 from oxidative effects during processing or storage.

Transfer gate 114 is a metal contact on N+InP cap layer 112 or may be exposed also to layer 110 in order to provide a bias potential on one or all of layers 110 and 112. The device design determines which layer is contacted, and once formed is not changed from a given layout. Transfer gate 114 forms an ohmic junction to layers 112 and 110. Structure 116 on cap layer 112 comprises a P+InP transfer well which is formed by traditional processes for pn-junction formation within III-V materials. Formation choices include ion implantation, diffusion or forming a "grown-in" homojunction via epitaxial growth. Transfer well 116 may be a continuous layer upon initial crystal growth, and may be etched back to form the discrete contact as shown in FIG. 1. Metal contact 118 on transfer well 116 is the drain. The drain contact material comprises typical contact metals for P-contacts on III-V materials, such materials include but are not limited to Pt, Ti, Ni, and Au.

Finally, dielectric polyimide encapsulation layer 120 covers photoconducting FET mesa structure 100.

Figure 2:
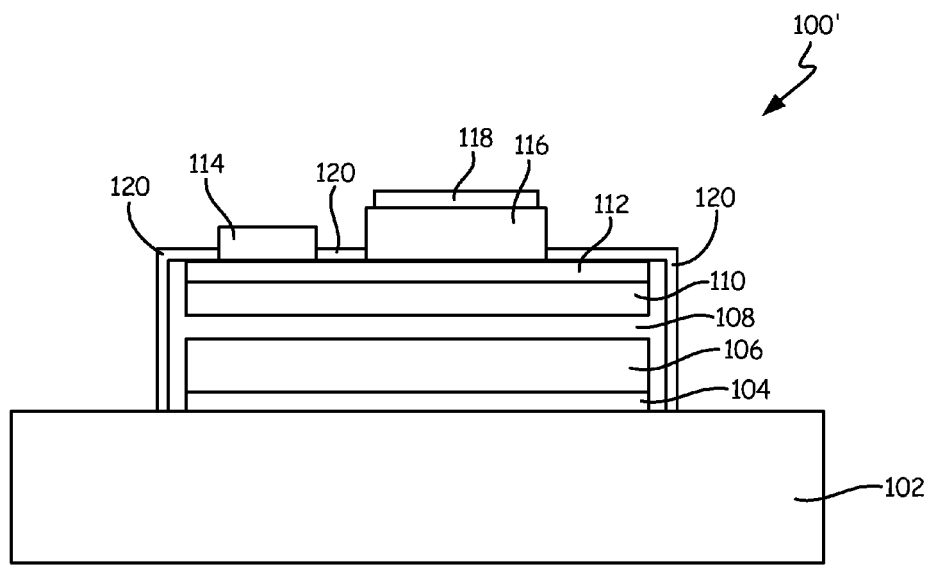
FIG. 2 is a schematic cross section of an embodiment of the invention.

Note in FIG. 1 the walls are sloped to maximize the volume of the active source material. Another embodiment is shown in FIG. 2 in which each layer of photoconducting field effect transistor 100 is numbered the same as in FIG. 1 but the walls are square and not sloped.

Figure 3:
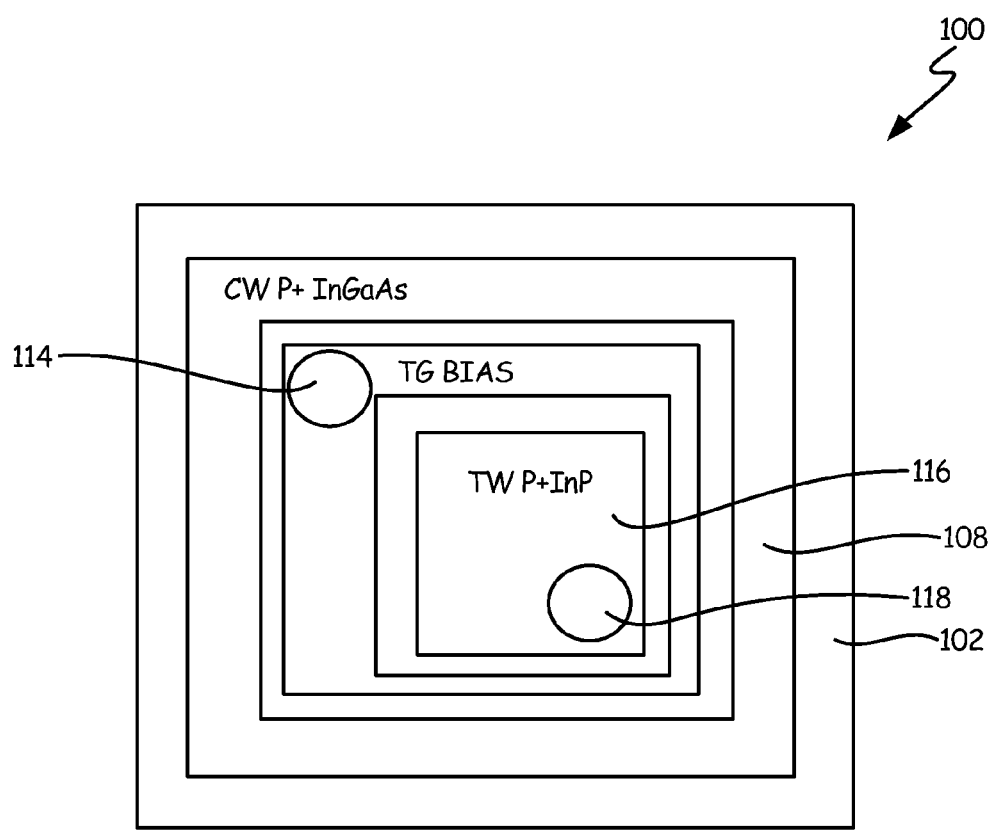
FIG. 3 is a schematic top view of the IR detector of the invention.

A top view of structure 100 is shown in FIG. 3 as an individual pixel with identical features numbered the same as in FIG. 1.

Discussion of Possible Embodiments

The following are non-exclusive descriptions of possible embodiments of the present invention.

A low noise infrared photo detector formed without thermal diffusion processes with a vertically integrated epitaxial field effect transistor (FET) structure can include: a high sensitivity photo detector layer; a charge well; a transfer well; a charge transfer gate and gate electrode; and a drain electrode.

The structure of the preceding paragraph can include optionally, additionally, and/or alternatively, any one or more of the following features, configurations, and/or additional components:

The photo detector layer and charge well may be buried between carrier migration barrier layers.

The photo detector layer may be InGaAs, or a member of the InAlGaAsP material system traditionally grown on InP substrates.

The photo detector layer may be InGaAs.

The carrier migration barrier layers may be selected from the group consisting of InP, InAlAs, and InAlGaAsP layers.

The carrier migration barrier layers may be InP.

The carrier migration barrier layers may comprise heterostructure layers in the InAlGaAsP material system with a concentration gradient comprising a stepped or continuous change in concentration across the layers.

The charge well may be InGaAs or a member of the InAlGaAsP material system traditionally grown on InP substrates.

The heterostructure layers may comprise binary, ternary, or quaternary compositions of the InAlGaAsP material system.

The charge transfer gate electrode and drain electrode may comprise Ti, Pt, Au, Ni, Cu, or combinations thereof.

The photo detector layer may be responsive to a signal with a wavelength in the range of 0.4 to 1.7 micrometers.

The charged transfer gate may be triggered by an external circuit that controls the collection of photo current.

A low noise infrared focal plane detector array with vertically integrated epitaxial field effect transistor (FET) structures wherein each FET structure may comprise: a high sensitivity photo detector layer; a charge well; a transfer well; a charged transfer gate and gate electrode; and a drain electrode.

The structure of the preceding paragraph can optionally include, additionally, and/or alternatively, any one or more of the following features, configurations, and/or additional components:

The photo detector and charge well may be buried between carrier migration barrier layers.

The photo detector layer may be InGaAs or a member of the InAlGaAsP material system traditionally grown on InP substrates.

The carrier migration barrier layers may be selected from the group consisting of InP, InAlAs, and InAlGaAsP layers.

The charge well may be InGaAs or a member of the InAlGaAsP material system traditionally grown on InP substrates.

The heterostructure layers may comprise binary, ternary, or quaternary compositions of the InAlGaAsP material system.

The charge transfer gate electrode and drain electrode may comprise Ti, Pt, Au, Ni, Cu, or combinations thereof.

A near IR camera system with a focal plane detector array with low noise IR photo detector elements formed without thermal diffusion processes with a vertically integrated epitaxial field effect transistor (FET) structure may comprise: a high sensitivity photo detector layer; a charge well; a transfer well; a charged transfer gate and gate electrode; and a drain electrode.

The structure of the preceding paragraph can optionally include, additionally, and/or alternatively, any one or more of the following features, configurations, and/or additional components:

The photo detector layer and charge well may be buried between carrier migration barrier layers.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A vertically integrated epitaxial field effect transistor structure, comprising:
    a high sensitivity photo detector layer;
    a charge well;
    a transfer well;
    a charge transfer gate electrode; and
    a drain electrode.

2. The photo detector of claim 1, wherein the photo detector layer and charge well are buried between carrier migration barrier layers.

3. The photo detector of claim 2, wherein the photo detector layer is InGaAs, or a member of the InAlGaAsP material system traditionally grown on InP substrates.

4. The photo detector of claim 3, wherein the photo detector layer is InGaAs.

5. The photo detector of claim 2, wherein the carrier migration barrier layers are selected from the group consisting of InP, InAlAs, and InAlGaAsP layers.

6. The photo detector of claim 5, wherein the carrier migration barrier layers are InP.

7. The photo detector of claim 2, wherein the carrier migration barrier layers comprise hetero structure layers in the InAlGaAsP material system with a concentration gradient comprising a stepped or continuous change in concentration across the layers.

8. The photo detector of claim 1, wherein the charge well is InGaAs or a member of the InAlGaAsP material system traditionally grown on InP substrates.

9. The photo detector of claim 7, wherein the heterostructure layers comprise binary, ternary or quaternary compositions of the InAlGaAsP material system.

10. The photo detector of claim 1, wherein the charge transfer gate electrode and drain electrode comprise Ti, Pt, Au, Ni, Cu, or combinations thereof.

11. The photo detector of claim 1, wherein the photo detector layer is responsive to a signal with a wavelength in the range of 0.4 to 1.7 micrometers.

12. The photo detector of claim 1, wherein the charge transfer gate electrode is triggered by an external circuit that controls the collection of photo current.

13. A low noise infrared focal plane detector array that includes a plurality of vertically integrated epitaxial field effect transistor structures, wherein each vertically integrated epitaxial field effect transistor structure comprises:
   a high sensitivity photo detector layer;
   a charge well;
   a transfer well;
   a charge transfer gate electrode; and
   a drain electrode.

14. The detector array of claim 13, wherein the photo detector layer and charge well are buried between carrier migration barrier layers.

15. The detector array of claim 13, wherein the photo detector layer is InGaAs or a member of the InAlGaAsP material system traditionally grown on InP substrates.

16. The detector array of claim 13, wherein the charge well is InGaAs or a member of the InAlGaAsP material system traditionally grown on InP substrates.

17. The detector array of claim 13, wherein the charge transfer gate electrode and drain electrode comprise Ti, Pt, Au, Ni, Cu, or combinations thereof.

18. A near IR camera system, comprising:
   a focal plane detector array that includes a plurality of low noise IR photo detector elements,
   wherein each low noise IR photo detector element is formed without thermal diffusion processes and includes a vertically integrated epitaxial field effect transistor structure, the vertically integrated epitaxial field effect transistor structure comprising:
      a high sensitivity photo detector layer;
      a charge well;
      a transfer well;
      a charge transfer gate electrode; and
      a drain electrode.

19. The near IR camera system of claim 18, wherein the photo detector layer and charge well are buried between carrier migration barrier layers.

20. A low noise infrared photo detector, formed without thermal diffusion processes, that includes the vertically integrated epitaxial field effect transistor structure of claim 1.

* * * * *